US008218590B2

(12) United States Patent
Youngner et al.

(10) Patent No.: US 8,218,590 B2
(45) Date of Patent: Jul. 10, 2012

(54) DESIGNS AND PROCESSES FOR THERMALLY STABILIZING A VERTICAL CAVITY SURFACE EMITTING LASER (VCSEL) IN A CHIP-SCALE ATOMIC CLOCK

(75) Inventors: Daniel W. Youngner, Maple Grove, MN (US); Son T. Lu, Plymouth, MN (US); Jeff A. Ridley, Shorewood, MN (US); Linda J. Forner, Carver, MN (US)

(73) Assignee: Honeywell International Inc., Morristown, NJ (US)

( * ) Notice: Subject to any disclaimer, the term of this patent is extended or adjusted under 35 U.S.C. 154(b) by 167 days.

(21) Appl. No.: 12/884,489

(22) Filed: Sep. 17, 2010

(65) Prior Publication Data

US 2011/0188524 A1 Aug. 4, 2011

Related U.S. Application Data

(60) Provisional application No. 61/301,497, filed on Feb. 4, 2010.

(51) Int. Cl.
*H01S 3/04* (2006.01)
(52) U.S. Cl. .......................................... 372/34; 331/94.1
(58) Field of Classification Search .................. 331/94.1, 331/3; 372/34
See application file for complete search history.

(56) References Cited

U.S. PATENT DOCUMENTS

| | | | |
|---|---|---|---|
| 7,075,962 B2 | 7/2006 | Ryou et al. | |
| 2004/0228377 A1 | 11/2004 | Deng et al. | |

OTHER PUBLICATIONS

Lutwak et al., "The MAC—A Miniature Atomic Clock", "Frequency Control Symposium and Exposition, 2005. Proceedings of the 2005 IEEE International", Aug. 29-31, 2005, Publisher: IEEE.*

Lutwak et al., "The Chip-Scale Atomic Clock-Prototype Evaluation", "39th Annual Precise Time and Time Interval (PTTI) Meeting", 2007.*

Laws et al., "Thermal and Structural Analysis of a Suspended Physics Package for a Chip-Scale Atomic Clock", "J. Electron. Packag.", Oct. 21, 2009, vol. 131, No. 4.

Lutwak et al., "The MAC—A Miniature Atomic Clock", "Frequency Control Symposium and Exposition, 2005. Proceedings of the 2005 IEEE International", Aug. 29-31, 2005, Publisher: IEEE.

Lutwak et al. , "The Chip-Scale Atomic Clock-Prototype Evaluation", "39th Annual Precise Time and Time Interval (PTTI) Meeting", 2007.

Youngner et al. , "U.S. Appl. No. 12/873,441; Apparatus and Methods for Alkali Vapor Cells", filed Sep. 1, 2010.

Youngner et al., "U.S. Appl. No. 12/879,394, Fabrication Techniques to Enhance Pressure Uniformity in Anodically Bonded Vapo", filed Sep. 10, 2010.

Youngner et al. , "U.S. Appl. No. 12/887,259; Design and Processes for Stabilizing a VCSEL in a Chip-Scale Atomic Clock", filed Sep. 21, 2010.

Youngner et al., "U.S. Appl. No. 12/891,441; Chip-Scale Atomic Clock With Two Thermal Zones", filed Sep. 27, 2010.

* cited by examiner

*Primary Examiner* — Patrick Stafford
*Assistant Examiner* — Tuan Nguyen
(74) *Attorney, Agent, or Firm* — Fogg & Powers LLC

(57) ABSTRACT

Designs and processes for thermally stabilizing a vertical cavity surface emitting laser (vcsel) in a chip-scale atomic clock are provided. In one embodiment, a Chip-Scale Atomic Clock includes: a vertical cavity surface emitting laser (vcsel); a heater block coupled to a base of the vcsel; a photo detector; a vapor cell, wherein the vapor cell includes a chamber that defines at least part of an optical path for laser light between the vcsel and the photo detector; and an iso-thermal cage surrounding the vcsel on all sides, the iso-thermal cage coupled to the heater block via a thermally conductive path.

20 Claims, 4 Drawing Sheets

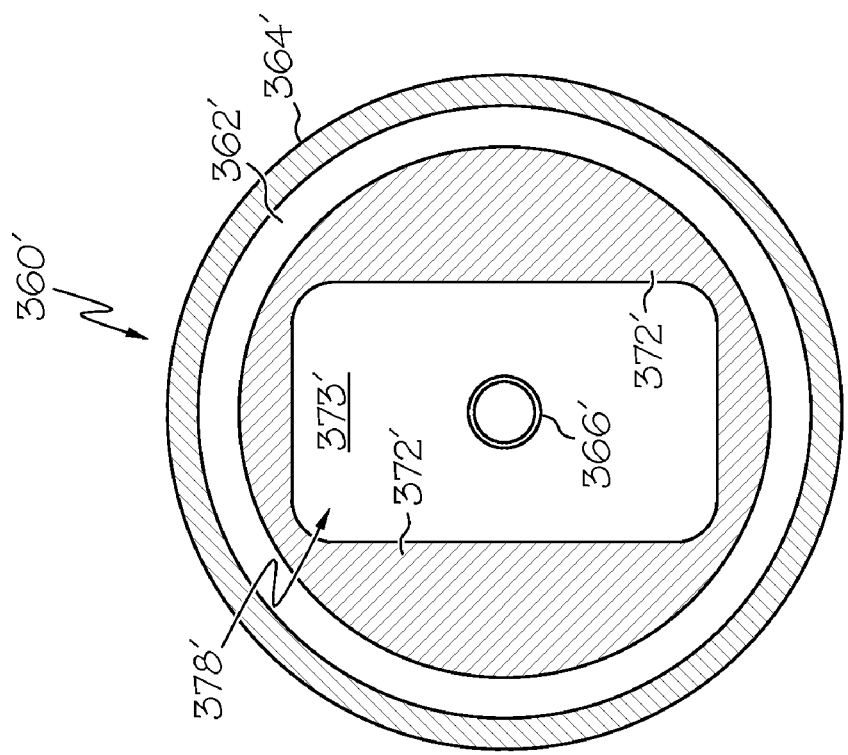
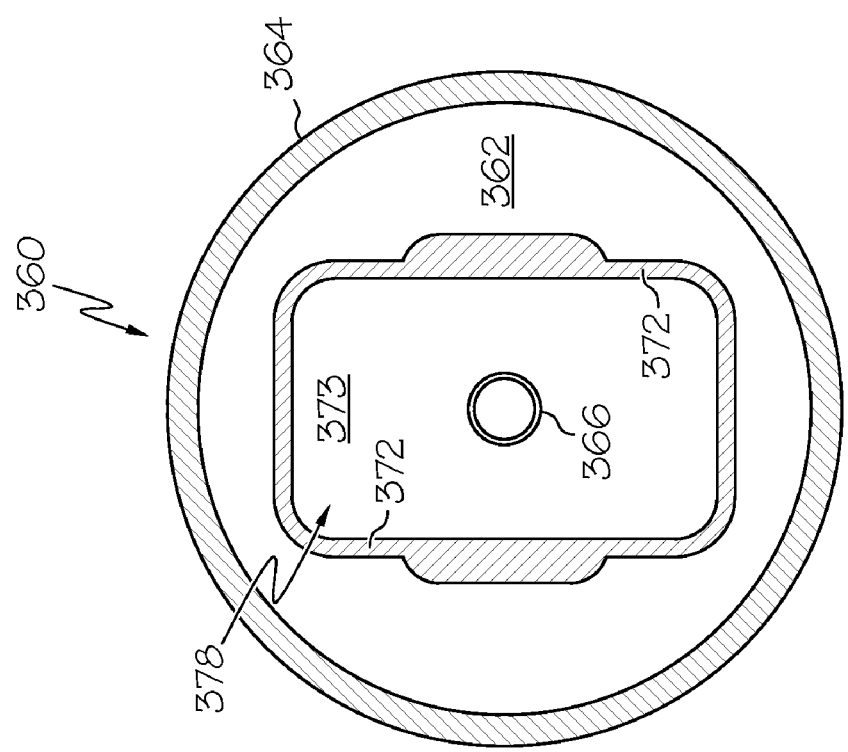

US 8,218,590 B2

DESIGNS AND PROCESSES FOR THERMALLY STABILIZING A VERTICAL CAVITY SURFACE EMITTING LASER (VCSEL) IN A CHIP-SCALE ATOMIC CLOCK

CROSS-REFERENCE TO RELATED APPLICATION

This application claims the benefit of U.S. Provisional Patent Application Ser. No. 61/301,497, filed on Feb. 4, 2010, which is incorporated herein by reference.

GOVERNMENT LICENSE RIGHTS

The U.S. Government may have certain rights in the present invention as provided for by the terms of Government Contract prime number FA8650-07-C-1125 with the U.S. Air Force.

BACKGROUND

Chip Scale Atomic Clocks (CSACs) are not simply shrunken versions of bench-top atomic clocks. Several attributes that are unique to CSACs dominate their stability, their performance in the field, their reliability, and the economics associated with succeeding in a CSAC-based business. One of the more challenging aspects of making CSACs involves dealing with the temperature variations that various CSAC-based systems encounter during use. Conservatively, equipment with CSACs in the field can see temperatures ranging from −40° C. to +65° C. In some environments temperatures approaching or even exceeding 100° C. are frequently encountered—particularly for vehicle-mounted equipment. Even though every CSAC manufacturer attempts to stabilize the temperature of their most sensitive components, the temperature sensitivity of the CSACs can still be a problem. This is because radiative coupling and gas-phase thermal conduction from various components inside the CSAC's physics package to the walls of the package can cause the temperature of those components to change.

In particular, the vcsel (vertical cavity surface emitting laser) in a CSAC is very sensitive to changes in temperature. For example, the base of the vcsel should be thermally stabilized to within a few thousandths of a degree to maintain precision operation. However, black-body radiation and thermal conduction through residual gas between the surface of the vcsel and the package walls can cause the upper light-emitting surface of the vcsel to change as ambient temperature changes. For example, as the ambient temperature changes from −40 C to +65 C, the surface of the vcsel could change by as much as 0.1 C, even if the base of the vcsel is held at a stable temperature to within a fraction of a millidegree.

For the reasons stated above and for other reasons stated below which will become apparent to those skilled in the art upon reading and understanding the specification, there is a need in the art for thermally stabilizing a vcsel in an atomic clock.

SUMMARY

The Embodiments of the present invention provide methods and systems for thermally stabilizing a vcsel in an atomic clock and will be understood by reading and studying the following specification.

In one embodiment, a Chip-Scale Atomic Clock comprises: a vertical cavity surface emitting laser (vcsel); a heater block coupled to a base of the vcsel; a photo detector; a vapor cell, wherein the vapor cell includes a chamber that defines at least part of an optical path for laser light between the vcsel and the photo detector; and an iso-thermal cage surrounding the vcsel on all sides, the iso-thermal cage coupled to the heater block via a thermally conductive path.

DRAWINGS

Embodiments of the present invention can be more easily understood and further advantages and uses thereof more readily apparent, when considered in view of the description of the preferred embodiments and the following figures in which:

FIGS. 3A and 3B are diagrams each illustrating cage walls and a cage ceiling for an iso-thermal cage of one embodiment of the present invention.

In accordance with common practice, the various described features are not drawn to scale but are drawn to emphasize features relevant to the present invention. Reference characters denote like elements throughout figures and text.

DETAILED DESCRIPTION

In the following descriptions, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical, electrical and method changes may be made without departing from the scope of the present invention. The following detailed description is, therefore, not to be taken in a limiting sense. Further, the various sections of this specification are not intended to be read in isolation but considered together with the teachings of the written description as a whole.

Embodiments of the present invention address the problem of vcsel thermal stability by surrounding the vcsel through 4π Steradians (that is, on all sides) with an iso-thermal cage. As discussed below, embodiments of the present invention can be produced using standard MEMS processing steps that one of ordinary skill in the art upon reading this specification would recognizes as being compatible with mass production. By surrounding the surface of the vcsel with the isothermal cage, radiative coupling and conductive coupling to the outside world are virtually eliminated, making it possible for the vcsel to remain thermally stable to within a fraction of a millidegree as the ambient temperature varies from −40 C to >65 C.

Figure 1:
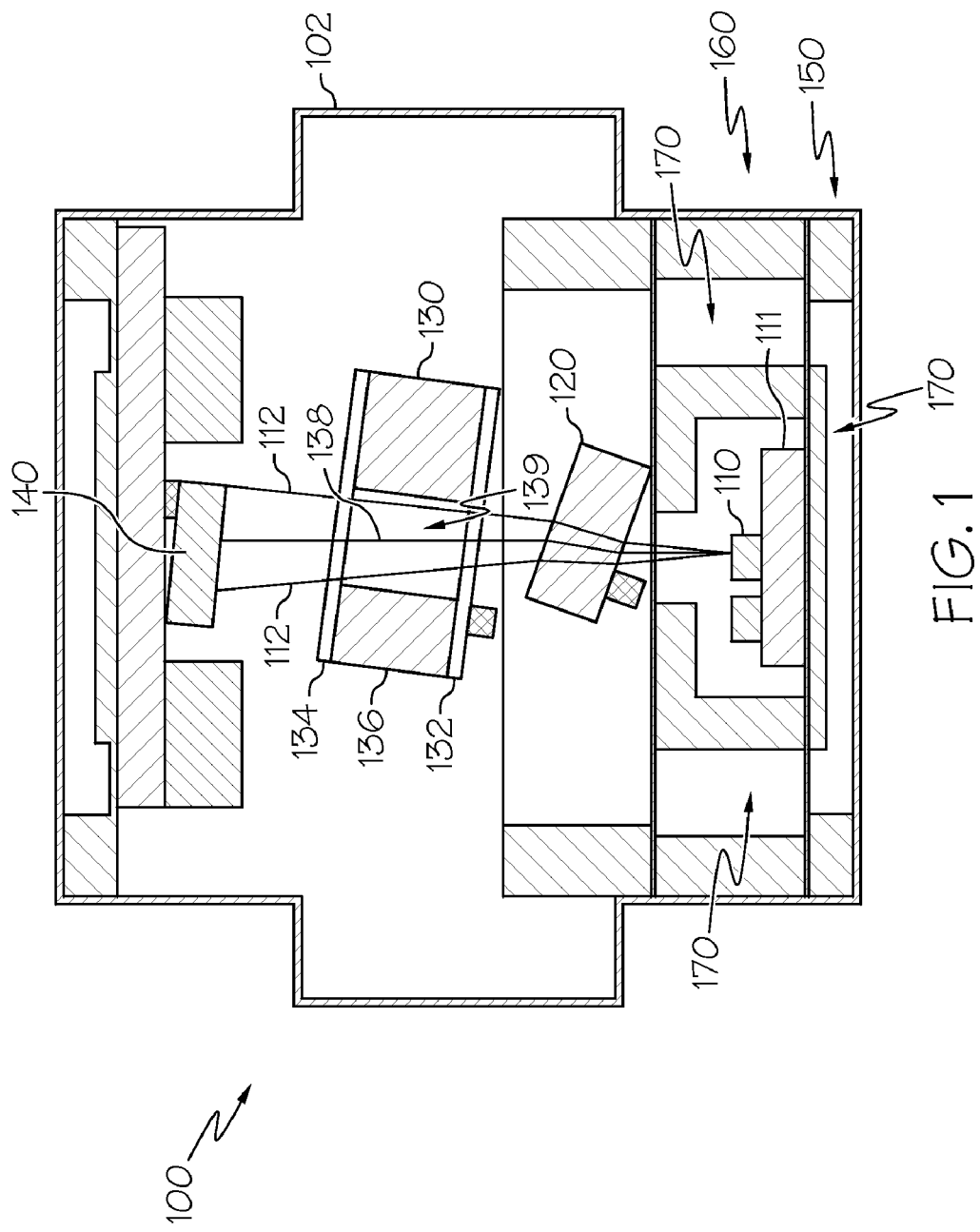
FIG. 1 is a diagram of a chip-scale atomic clock of one embodiment of the present invention.

FIG. 1 provides a cross-sectional view of a Physics Package 102 for a CSAC 100 of one embodiment of the present invention. CSAC 100 comprises a vertical cavity surface emitting laser 110 (vcsel) mounted and thermally coupled to a controllable heater block 111, a quarter wave plate (QWP)/neutral density filter (NDF) 120, a vapor cell 130 and a photo detector 140. In one embodiment of the present invention, anodic bonding is used during production of vapor cell 130 to seal optically clear glass wafers 132 and 134 (for example, Pyrex or similar glass) to a silicon wafer substrate 136. At least one chamber 138 defined within vapor cell 130 to provides an optical path (shown at 139) between vcsel 110 and photo detector 140 for laser light 112 transmitted by vcsel 110. In one embodiment, another independent heater is provided around the vapor cell 130. The vcsel 110 and heater block 111 are supported within physics package 102 by a vcsel scaffold 150 comprising a silicon material. The quarter wave plate (QWP)/neutral density filter (NDF) 120 is supported within physics package 102 by a QWP scaffold 160, also comprising a silicon material. A $4\pi$ steradian iso-thermal cage (shown generally at 170) around vcsel 110 is formed when the QWP scaffold 160 is mounted in place onto the vcsel scaffold 150, as explained in greater detail below. An orifice 160 in the QWP scaffold provides an opening for the laser light 112 generated by vcsel 110 to exit the iso-thermal cage 170. Moreover, there are layers of solder connecting all of the silicon components and connecting the various portions of the package (as described in U.S. Provisional Patent Application Ser. No. 61/301,497 which is herein incorporated by reference).

Although temperature is regulated at the heater block 111, the temperature at the emitting surface of the vcsel 110 potentially could be several 10ths of a degree warmer than the base if black body radiation and trace gas thermal conduction were allowed to thermally couple vcsel 110 to the physics package 102. This is because when power is applied to the vcsel 110 die, the lasing surface at the top of the vcsel 110 die heats up, and that heat at the surface has to flow through the thermally-resistive body of vcsel 110 to reach the thermally-stabilized block 111 and package 102. For example, absent iso-thermal cage 170, if the outside walls of physics package 102 are exposed to cold exterior atmospheric conditions, black body radiation coupling would be established between vcsel 110 and physics package 102. Embodiments of the present invention make sure that the temperature of the iso-thermal cage 170 is at the same temperature as the base of heater block 111, which will be the same temperature as the base of vcsel 110. This configuration defeats black-body coupling between vcsel 110 and physics package 102, and trace gas thermal conduction, because such coupling cannot be established through the thermal barrier established by the heated iso-thermal cage 170. This in turn ensures that there will be a fixed thermal offset between the lasing surface of vcsel 110 and its thermally-stabilized base provides by block 111, regardless of ambient temperatures.

Figure 2:
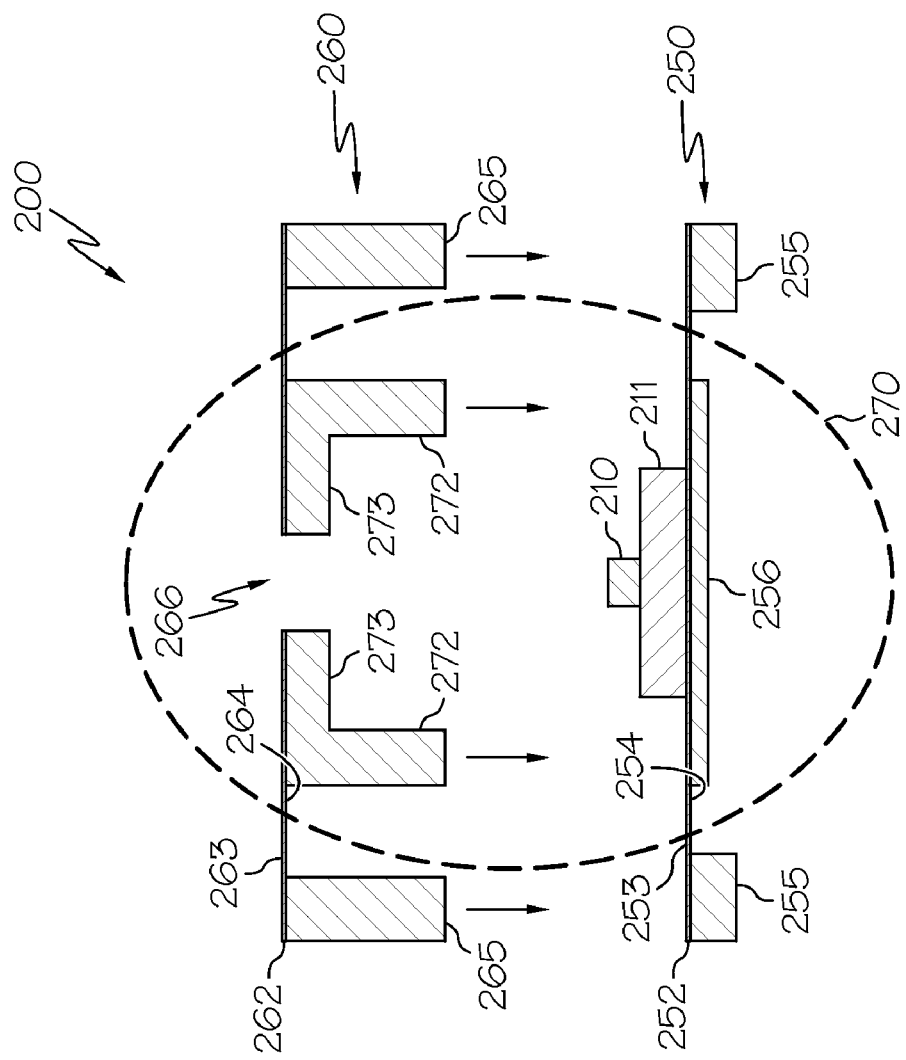
FIG. 2 is a diagram of an iso-thermal cage of one embodiment of the present invention.

FIG. 2 is a partially exploded cross-sectional diagram generally at 200 illustrating the formation of a $4\pi$ steradian iso-thermal cage 270 formed from mounting a QWP scaffold 260 onto the vcsel scaffold 250.

Vcsel scaffold 250 comprises a thermally resistive, structurally supportive, first support member 252 having a first surface 253 and a second surface 254, at least one silicon second support member 255 attached to the second surface 254, and a block of silicon material 256 attached to the second surface 254. In the embodiment shown in FIG. 2, the silicon material block 256 is approximately centered on first support member 252. In one embodiment, the Vcsel scaffold 150 of FIG. 1 comprises the structure illustrated by vcsel scaffold 250. The first surface 253 of first support member 252 supports a heater block 211 which is coupled to the base of vcsel 210. In one embodiment, the a thermally resistive, structurally supportive, first support member 252 is made from polyimide.

QWP scaffold 260 comprises a first support member 262 having a first surface 263 and a second surface 264 and at least one silicon second support member 265 attached to the second surface 264. QWP scaffold 260 further comprises silicon material attached to the second surface 264 of QWP scaffold 260 that define cage walls 272 and a cage ceiling 273 of the iso-thermal cage 270 formed when the QWP scaffold 260 is brought down from above and positioned on vcsel scaffold 250. An orifice 266 in the cage ceiling 273 an opening through first support member 262 for the laser light generated by vcsel 210 to exit the iso-thermal cage 270 (and in one embodiment, focus on a photo detector, such as shown in FIG. 1).

As shown in FIG. 2, the cage walls 272 make contact with the vcsel scaffolding 250 above the silicon block 256, which functions the cage base of the iso-thermal cage 270. Silicon block 256 provides a thermally conductive path so that the cage walls 272 and ceiling 272 are thermally coupled to heater block 211 via the thermally conductive silicon material block 256, rather than being placed in direct contact with heater block 211. In operation, thermal energy produced by heater block 211 thus conductively provides heat to the base of vcsel 210 as well as the silicon base 256, walls 272 and ceiling 272 that form the iso-thermal cage 270 that surrounds vcsel 210.

FIGS. 3A and 3B provides alternate embodiments for QWP scaffolding 260. Looking down upon the second surface 264 of the QWP scaffolding 260, FIG. 3A illustrates a silicon support member 364, cage walls 372, cage ceiling 373, orifice 360, and an inner thermal chamber 378 formed within silicon cage 270 that houses vcsel 210 and heater block 211. FIG. 3B illustrates an alternate configuration with a silicon support member 364', cage walls 372', cage ceiling 373', orifice 360', and an inner thermal chamber 378' formed within silicon cage 270 that houses vcsel 210 and heater block 211.

For the embodiments described in the FIGS. 1, 2 and 3A-3B and their descriptions above, a consistent temperature is maintained at the vcsel (110, 210) by thermally isolating the vcsel within an iso-thermal cage (170, 270) thus preventing black-body radiation coupling between the vcsel, the physics package, or any other component within the CSAC.

Figure 4:
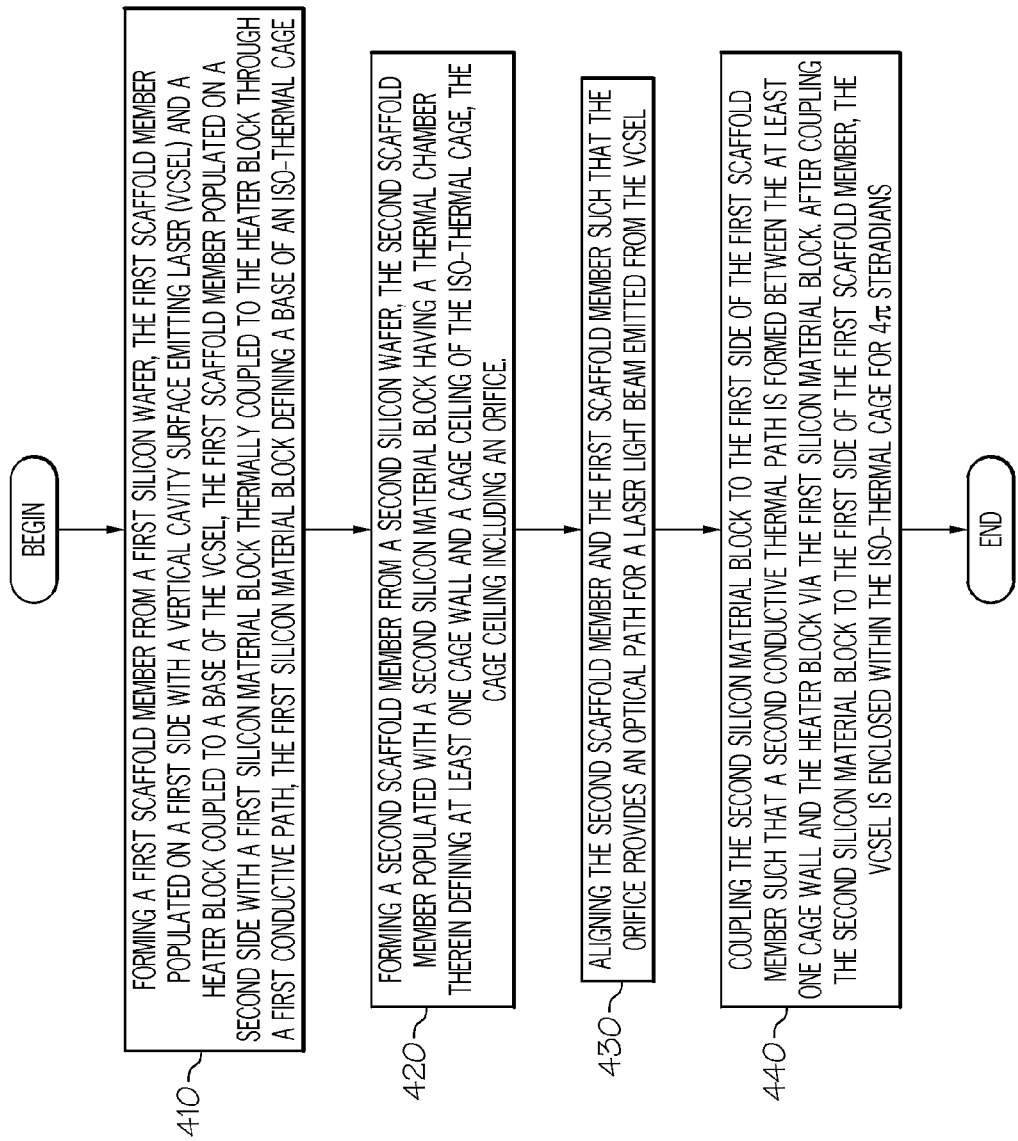
FIG. 4 is a flow chart illustrating a method of one embodiment of the present invention.

FIG. 4 is a flow chart illustrating a method of one embodiment of the present invention. In one embodiment, the method shown in FIG. 4 provided for thermal isolation of a vertical cavity surface emitting laser (vcsel) assembly. One of ordinary skill in the art upon reading this specification would appreciate that standard MEMS processing techniques may be applied to perform the steps described in FIG. 4. The method of FIG. 4 provides for vcsel thermal stability by surrounding the surface of the vcsel with an isothermal cage. As previously explained, with the iso-thermal cage provided by embodiments of the present invention, radiative coupling and conductive coupling to components outside the iso-thermal cage are virtually eliminated, making it possible for the vcsel to remain thermally stable to within a fraction of a millidegree. The stability provided by the iso-thermal cages presented herein further provide for consistent operation the vcsel of a chip scale atomic clock at its desired operating point.

The method begins a 410 with forming a first scaffold member from a first silicon wafer, the first scaffold member populated on a first side with a vertical cavity surface emitting laser (vcsel) and a heater block coupled to a base of the vcsel, the first scaffold member populated on a second side with a first silicon material block thermally coupled to the heater block through a first conductive path, the first silicon material block defining a base of an iso-thermal cage.

The method proceeds to 420 with forming a second scaffold member from a second silicon wafer, the second scaffold member populated with a second silicon material block having a thermal chamber therein defining at least one cage wall and a cage ceiling of the iso-thermal cage, the cage ceiling including an orifice.

The method proceeds to 430 with aligning the second scaffold member and the first scaffold member such that the orifice provides an optical path for a laser light beam emitted from the vcsel.

The method proceeds to 440 with coupling the second silicon material block to the first side of the first scaffold member such that a second conductive thermal path is formed between the at least one cage wall and the heater block via the first silicon material block. After coupling the second silicon material block to the first side of the first scaffold member, the vcsel is enclosed within the iso-thermal cage for $4\pi$ steradians.

As illustrated previously in FIG. 2, the first scaffold member and the second scaffold will be secured within a physics package and the iso-thermal cage is positioned within the physics package to prevent black-body coupling between the vcsel and components external to the iso-thermal cage. The vcsel and the orifice are optically aligned within the physics package such that the laser light beam is focused on a photo detector. In one embodiment, the physics package further includes a vapor cell external to the iso-thermal cage that defines at least part of the optical path for laser light between the vcsel and the photo detector.

Although the embodiments above generally describe embodiments of a vcsel utilized in the context of Chip-Scale Atomic Clocks, embodiments of the present invention are not only limited to Chip-Scale Atomic Clock applications. Other applications for vcsel are contemplated as within the scope of embodiments of the present invention. Further, although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A Chip-Scale Atomic Clock comprising:
a vertical cavity surface emitting laser (vcsel);
a heater block coupled to a base of the vcsel;
a photo detector;
a vapor cell, wherein the vapor cell includes a chamber that defines at least part of an optical path for laser light between the vcsel and the photo detector; and
an iso-thermal cage surrounding the vcsel on all sides, the iso-thermal cage coupled to the heater block via a thermally conductive path.

2. The Chip-Scale Atomic Clock of claim 1, the iso-thermal cage further comprising an orifice that defines at least part of the optical path for laser light between the vcsel and the photo detector.

3. The Chip-Scale Atomic Clock of claim 1, further comprising:
a first scaffold member configured to support the vcsel and the heater block within a physics package, the first scaffold member comprising a first support member;
wherein the first support member includes a first surface coupled to the heater block and a second surface having a first silicon material block coupled thereto, the first silicon material block defining a base of the iso-thermal cage, the first silicon material block thermally coupled to the heater block via a first conductive path through the first support member.

4. The Chip-Scale Atomic Clock of claim 3, the iso-thermal cage further comprising at least one cage wall and a cage ceiling;
wherein the at least one cage wall and cage ceiling are thermally coupled via a second conductive path through the first support member to the first silicon material block.

5. The Chip-Scale Atomic Clock of claim 4, wherein the cage ceiling includes an orifice that defines at least part of the optical path for laser light between the vcsel and the photo detector.

6. The Chip-Scale Atomic Clock of claim 3, the first support member further comprising at least one silicon second support member positioned external to the iso-thermal cage and coupled to the first support member, the at least one silicon second support member securing the first scaffold member to the physics package.

7. The Chip-Scale Atomic Clock of claim 3, further comprising:
a second scaffold member comprising a third support member and a second silicon material block coupled to the third support member;
the second silicon material block forming at least one cage wall of the iso-thermal cage and a cage ceiling of the iso-thermal cage;
wherein the at least one cage wall and cage ceiling are thermally coupled via a second conductive path through the first support member of the first scaffold to the first silicon material block.

8. The Chip-Scale Atomic Clock of claim 7, wherein the cage ceiling includes an orifice that defines at least part of the optical path for laser light between the vcsel and the photo detector.

9. The Chip-Scale Atomic Clock of claim 7, the third support member further comprising at least one silicon fourth support member positioned external to the iso-thermal cage and coupled to the third support member securing the second scaffold member to the first scaffold member.

10. The Chip-Scale Atomic Clock of claim 3, the iso-thermal cage positioned within the physics package to prevent black-body coupling between the vcsel and components external to the iso-thermal cage.

11. A vertical cavity surface emitting laser (vcsel) assembly, the assembly comprising:
a vertical cavity surface emitting laser vcsel;
a heater block coupled to a base of the vcsel; and
an iso-thermal cage surrounding the vcsel on all sides, the iso-thermal cage coupled to the heater block via a thermally conductive path.

12. The assembly of claim 11, the iso-thermal cage further comprising an orifice aligned with the vcsel, the orifice providing an optical path out of the iso-thermal cage for laser light emitted from the vcsel.

13. The assembly of claim 11, the iso-thermal cage further comprising a cage base, at least one cage wall and a cage ceiling;
wherein the at least one cage wall and cage ceiling are thermally coupled via a conductive path through the cage base to the heater block.

14. The assembly of claim 11, further comprising:
a first scaffold member configured to support the vcsel and the heater block within a physic package, the first scaffold member comprising a first support member;
wherein the first support member includes a first surface coupled to the heater block and a second surface coupled to the cage base, the cage base thermally coupled to the heater block via a conductive path through the first support member.

15. The assembly of claim 11, wherein the first support member and the cage base are formed from a first silicon wafer, and the least one cage wall and cage ceiling are formed from a second silicon wafer.

16. A method for providing thermal isolation of a vertical cavity surface emitting laser (vcsel) assembly, the method comprising:
forming a first scaffold member from a first silicon wafer, the first scaffold member populated on a first side with a vertical cavity surface emitting laser (vcsel) and a heater block coupled to a base of the vcsel, the first scaffold member populated on a second side with a first silicon material block thermally coupled to the heater block through a first conductive path, the first silicon material block defining a base of an iso-thermal cage;
forming a second scaffold member from a second silicon wafer, the second scaffold member populated with a second silicon material block having a thermal chamber therein defining at least one cage wall and a cage ceiling of the iso-thermal cage, the cage ceiling including an orifice;
aligning the second scaffold member and the first scaffold member such that the orifice provides an optical path for a laser light beam emitted from the vcsel; and
coupling the second silicon material block to the first side of the first scaffold member such that a second conductive thermal path is formed between the at least one cage wall and the heater block via the first silicon material block;
wherein after coupling the second silicon material block to the first side of the first scaffold member, the vcsel is enclosed within the iso-thermal cage on all sides.

17. The method of claim 16, further comprising:
securing the first scaffold member and the second scaffold member within a physics package.

18. The method of claim 17, wherein the iso-thermal cage is positioned within the physics package to prevent black-body coupling between the vcsel and components external to the iso-thermal cage.

19. The method of claim 17, wherein the vcsel and the orifice are optically aligned within the physics package such that the laser light beam is focused on a photo detector.

20. The method of claim 19, wherein the physics package further includes a vapor cell external to the iso-thermal cage that defines at least part of the optical path for laser light between the vcsel and the photo detector.

* * * * *